(12) United States Patent
Kawakami

(10) Patent No.: US 6,555,855 B2
(45) Date of Patent: Apr. 29, 2003

(54) SOLID STATE IMAGING DEVICE

(75) Inventor: Yukiya Kawakami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/750,065

(22) Filed: Dec. 29, 2000

(65) Prior Publication Data

US 2001/0007363 A1 Jul. 12, 2001

(30) Foreign Application Priority Data

Jan. 6, 2000 (JP) ........................... 2000-000584

(51) Int. Cl.$^7$ ................ H01L 27/148; H01L 29/768
(52) U.S. Cl. ............... 257/232; 257/233; 257/234; 257/257; 257/258; 257/291; 257/292
(58) Field of Search ............... 257/59, 215, 222, 257/223, 228, 224, 232, 233, 234, 243, 244, 291, 292, 257, 258

(56) References Cited

U.S. PATENT DOCUMENTS 5,668,390 A * 9/1997 Morimoto .................. 257/232

* cited by examiner

Primary Examiner—Tom Thomas
Assistant Examiner—Thien F Tran
(74) Attorney, Agent, or Firm—Young & Thompson

(57) ABSTRACT

Minority carriers generated by photoelectric conversion in an isolation layer and a semiconductor region with the same conduction type as that of the isolation layer are provided with an effective diffusion length owing to a trench formed in the isolation layer and with no path, which could be a straight escape route for the minority carriers, and false signals, therefore, scarcely enters to a neighboring cell, so that smear and color interference can be suppressed.

19 Claims, 6 Drawing Sheets

SOLID STATE IMAGING DEVICE

BACKGROUND OF THE INVENTION

1. Field of the Invention

The present invention relates to a solid state imaging device, particularly to amendment of deterioration of image quality that caused by false signals of a photoelectric conversion charge.

2. Description of the Prior Art

A solid state imaging device such as an interline type CCD image sensor or like that has a configuration composed of a photodiode 1, a CCD region 2, an isolation layer 3, a charge read-out region 4 and a neighbor CCD region 22 to the photodiode 1 as shown in FIG. 1A. In FIG. 1, FIG. 1A is a plane view of a pixel and FIG. 1B is a cross-section of FIG. 1A cut along X-X'. In the solid state imaging device except for CCD, the region equivalent to the CCD region 2 is, though being not illustrated, a drain region of a transistor. Each of those solid state imaging device converts photo-signals coming in the photodiode 1 to electric charge signals by photoelectric conversion mechanism. These signal charges accumulated in the photodiode are read out by applied voltage to a transfer electrode (not illustrated) over an insulating film 9 in order to be taken out as electric signals.

When intense incident light comes to the solid state imaging device, an output image sometimes shows a color which does not originally exist in a photogenic object or thin vertical stripes. These phenomena came from false signals generated by that light rays which ought to come into a photodiode of a solid state imaging device. These rays are reflected or diffracted and converted to electric charge under the light shielding area, or the electric charge generated diffuses and comes in a neighboring photodiode and/or CCD region.

If such a diffusion charge comes in the neighboring photodiode across the isolation layer from the photodiode that covered by a color filter, it causes a false signal called "color interference" and if such a diffusion charge comes in the CCD across the charge read-out region or an isolation layer, it causes a false signal called smear. Such false signals cause deterioration of the image quality.

The charge diffusion in a semiconductor is a common phenomenon caused by thermal effect even without electronic field. And the charge generated by photoelectric conversion has a long life until recombination since the electric charge is minority carriers in the isolation layer and a semiconductor region with the same conduction type as that of the isolation layer, the portion of electric charges reach a neighboring cell by diffusion during image pick-up duration.

Especially, the smaller the pixel size of the solid state imaging device is, the more serious the problem that caused by the false signal by the diffusion of photoelectric conversion charge in the isolation layer is.

SUMMARY OF THE INVENTION

An object of the present invention is therefore to provide a solid state imaging device capable of eliminating false signals caused by electric charge that is generated by photoelectric conversion and diffuses and comes in a neighboring photodiode and a CCD region.

In order to solve such a problem, inventors of the present invention provide a following solid state imaging device.

That is, a solid state imaging device of the present invention has a basic configuration comprising: a first conduction type semiconductor region, a plurality of photodiode diffusion layers with the first conduction type formed in the semiconductor region; opposite conduction type isolation layers formed shallower than a plurality of the photodiode diffusion layers in the semiconductor region and separating a plurality of the photodiode diffusion layers from one another; and trenches formed in the isolation layers and filled with an insulator material.

In the solid state imaging device with the basic structure of the present invention, a variety of embodiments are available for the trenches filled with the insulator material.

In the first practical embodiment, the trenches filled with the insulator material are formed in isolation layers which are located on the opposite to a charge read-out region neighboring the photodiode diffusion layer in relation to the photodiode diffusion layer.

In the second practical embodiment, the trenches filled with the insulator material are formed in isolation layers which are located between photodiode diffusion layers along charge transfer regions.

In the third practical embodiment, the trenches filled with an insulator material are formed in isolation layers which are located on the opposite to a charge read-out region neighboring the photodiode diffusion layer in relation to the photodiode and in isolation layers which are located between photodiode diffusion layers along charge transfer regions.

In the fourth practical embodiment, the trenches filled with an insulator material are formed at a plurality of positions at intervals from one another in the isolation layer in the solid state imaging device with the foregoing basic configuration and the solid state imaging device of the foregoing first, second, or third practical embodiment.

In the fifth practical embodiment, the trenches filled with the insulator material are formed as to have a continuous shape in the foregoing isolation layer in the solid state imaging device with the foregoing basic configuration and the solid state imaging device of the forgoing first, second, or third practical embodiment.

In the sixth practical embodiment, the photodiode diffusion layers in the solid state imaging device with the foregoing basic configuration and the solid state imaging devices of all of the forgoing practical embodiments have cap layers with opposite conduction type on the surfaces.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
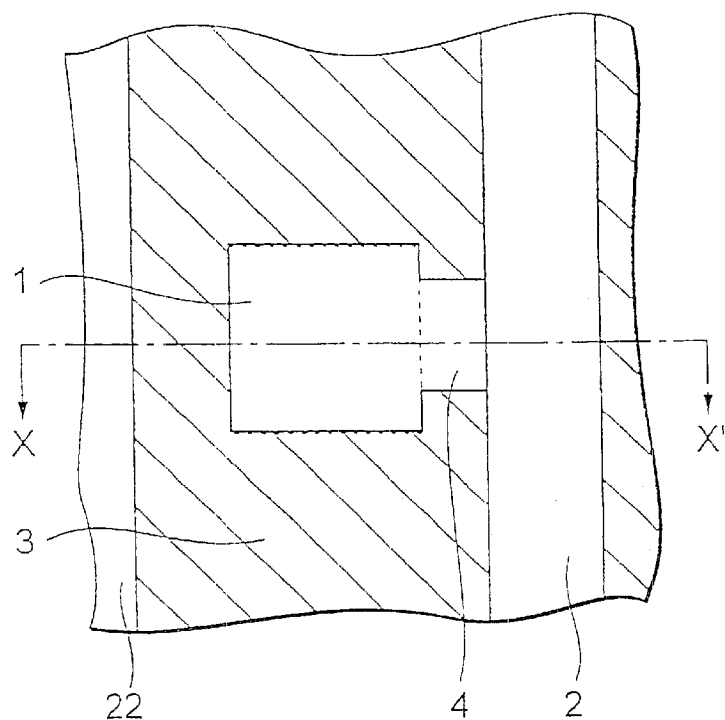
FIGS. 1A and 1B are a plane view and a cross-sectional view of a conventional solid state imaging device.
Figure 1B:
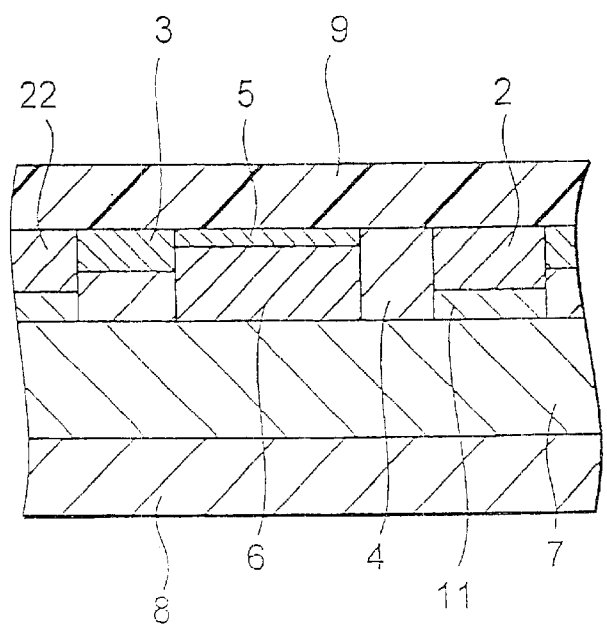

Before description of examples of the present invention, there will be described charge diffusion to be a subject to be solved in the present invention.

In case of considering silicon (Si) as a semiconductor, the mean free path (the average distance of particle movement before being disturbed by collision or being scattered) of electrons by thermal diffusion is about 0.1 µm. Consequently, the width of a P-type isolation layer is required to be 0.1 µm at least.

In addition to that, though a mean relaxation time (an average time before particles to come into collision or be scattered) of those electrons is about 1 pico-second, the time until recombination of electrons in the P-type Si is about 1µ-second. In other words, until recombination, electrons repeatedly come into collision $10^6$ times to move every 0.1 µm in random directions. Consequently, the probability that one electron enters in a neighboring cell is proportional to the nth power of q wherein q denotes the probability of electrons moving in the direction toward the neighboring cell and n denotes the integer ratio of the width of the isolation layer to the mean free path. As a result, in order to lower the probability as much as possible, q is required to be small or n to be high.

Conventionally, the reason why such false signal attributed to charge diffusion has not become obvious is because the width of the isolation layer has been 0.5 µm at least as a mask size and therefore, electrons repeat collision at least 5 times until electrons directly enter a neighboring cell and are decreased to a level in quantity by recombination or dispersion during the movement resulting in ignorable influence to the image quality of a solid state imaging device. Therefore, in order to suppress the false signals, it is sufficient to make the path in which the charge is diffused 0.5 µm at least, corresponding to the necessity, that is, either to make the number n bigger or to make the number q smaller, in other words, to keep the path in which electric charge moves away from the straight one.

In the case, the surface of a photodiode where lights come in is covered with a P$^+$-type semiconductor and electrons are accumulated in an N-type semiconductor thereunder and the N-type semiconductor is surrounded with an isolation layer of P$^+$-type semiconductor, a part of electrons generated in the P$^+$-type layer in the surface diffuse into the P$^+$-type region of the same surface and the isolation layer and thus electrons reach not only the N-type semiconductor region where electrons are to be originally accumulated but also another N-type semiconductor region in the surrounding of the former. For that, by replacing apart of the P$^+$-type isolation layer with an insulator resulting in electrons being inhibited from straightly moving in the region, in other words, bypassing the region. At the same time, the diffusion distance can be elongated with no need of widening the isolation layer.

Then, embodiments of the present invention will be described in detail with reference to drawings.

Figure 2A:
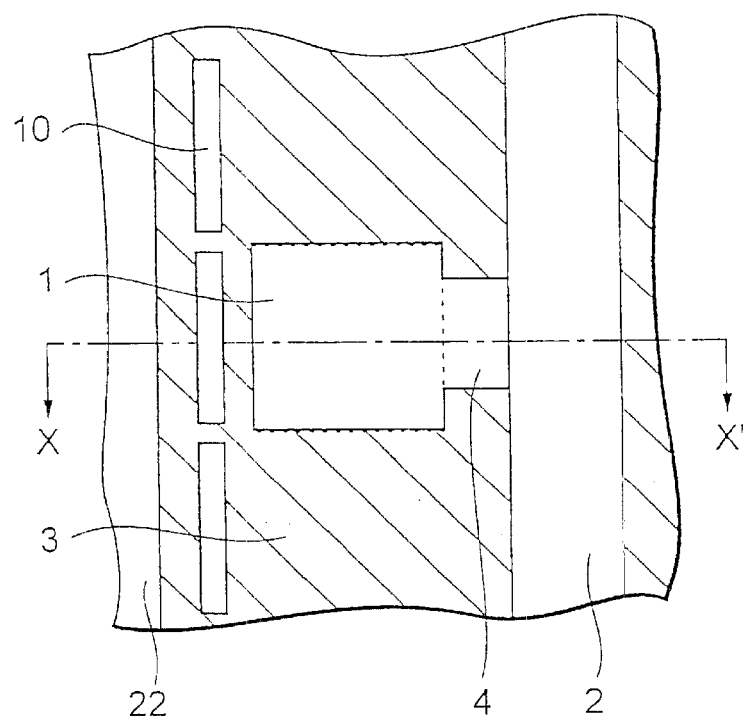
FIGS. 2A and 2B are a plane view and a cross-sectional view of a solid state imaging device of a first embodiment according to the present invention.
Figure 2B:
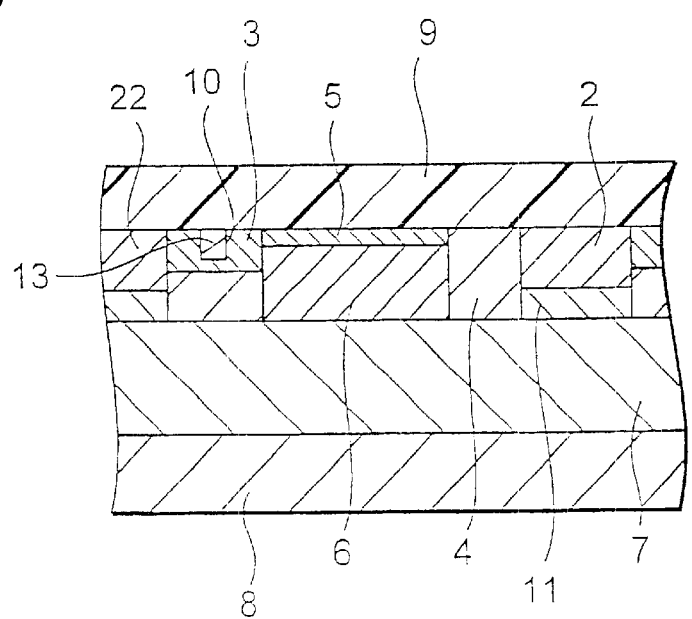

FIG. 2 shows a first embodiment of the present invention. FIG. 2A shows a plane view of a pixel to see the pixel from the upper side and FIG. 2B is a cross-sectional view of the pixel cutting along a cutting line X-X' shown in FIG. 2A.

In FIG. 2A, a plane view, the pixel is composed of a photodiode 1, a CCD region 2, an isolation layer 3, a charge read-out region 4 and a CCD region 22 neighboring to the photodiode 1. A trench 10 exists in the inside of the isolation layer 3 between the photodiode 1 and the CCD region 22 neighboring to the photodiode 1. In FIG. 2B, a cross-section view, the photodiode 1 is composed of P$^+$-type layer 5, an N-type layer 6, a P-type layer 7, a P-type layer 11 in a COD region, an N-type layer 2 of the COD region, and a N-type substrate 8.

Further, a conductive film to be a gate electrode and constituent elements such as a passivation film or the like thereon are omitted in the drawings. The photodiode 1 is surrounded with the isolation layer 3 and an insulator film 9 is formed thereon. The trench 10 is grooved in the isolation layer 3 and while being surrounded with the isolation layer 3, which is a P$^+$-type region, and the insulator film 9, the inside of the trench 10 is filled with an insulator 13 of an insulating substance for filling.

The trench 10 can be formed, at any appropriate process before the conductive film being formed as a gate in the mid of the fabrication process of the solid state imaging device, by forming an opening by the etching process, growing an electrically insulator film by CVD or the like, and cutting off the projecting part above the N-type substrate surface by CMP.

The depth of the trench 10 is deeper than junction formed by the P$^+$-type layer 5 and the N-type layer 6 and, if possible, preferably 0.25 µm or deeper. It is because a 0.5 µm longer path for electrons can be obtained by forcing them to pass along the deep part of the bottom of the trench 10.

Accomplished such a cell configuration, the movement distance of electrons till they reach a neighboring cell is extended, so that smear which is caused by diffusion of electrons generated in the P$^+$-type layer 5 to the CCD region 22 can be suppressed. On the other hand, forming a trench in a semiconductor increases interface states and then possibly causes dark current, however in the case of forming a trench in the inside of a region filled with free electric charge (in this case "hole") just like in a P$^+$-type region, the interface states are filled with the free electric charge, so that increase of the dark current can be suppressed.

When the P$^+$-type layer 5 is thick, the efficient diffusion distance of electrons can not be elongated without the trench 10 being deepened according to the P$^+$-type layer thickness. In that case, the stress, which is generated owing to the difference of the elasticity between the filling insulator 13 buried in the trench 10 and silicon, increases. Therefore, the trench 10 may be divided as to relax the stress as shown in FIG. 2A.

Figure 3A:
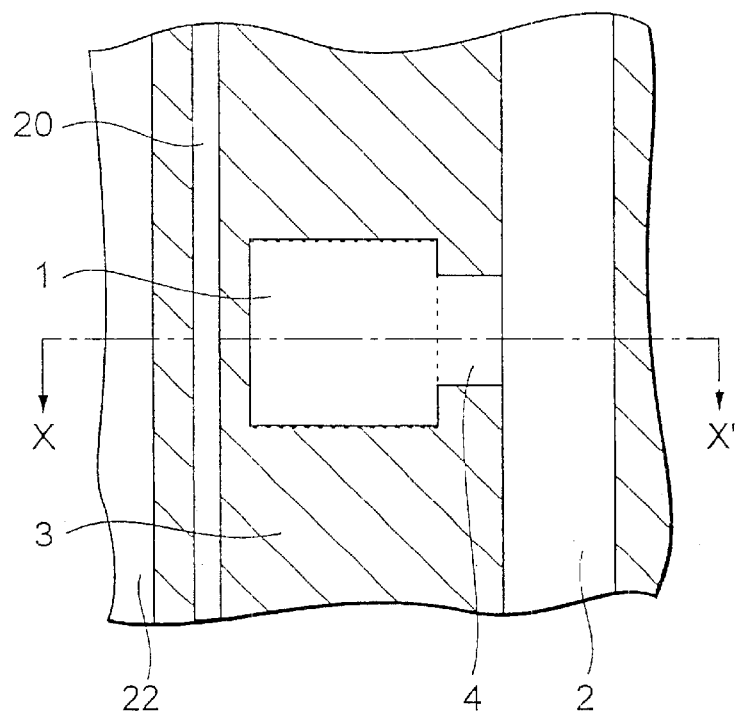
FIGS. 3A and 3B are a plane view and a cross-sectional view of a solid state imaging device of a second embodiment according to the present invention.
Figure 3B:
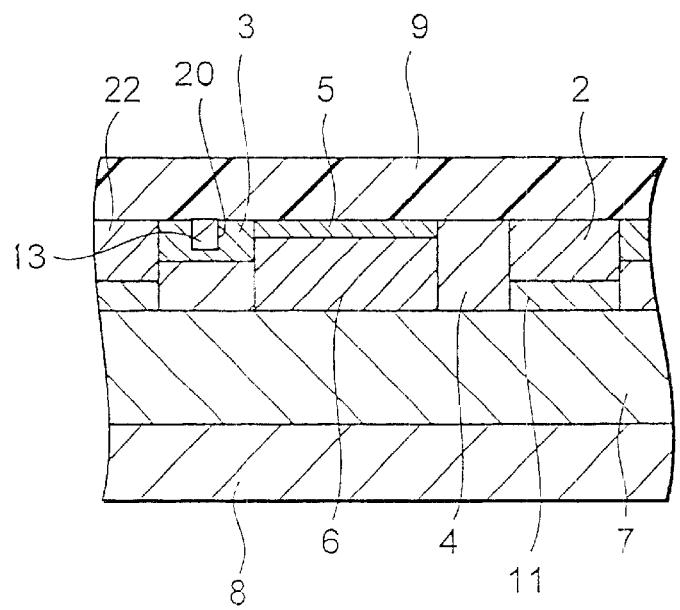

Next, the second embodiment of the present invention will be described with reference to FIG. 3. FIG. 3A shows a plane view of a pixel to see the pixel from the upper side and FIG. 3B is a cross-sectional view of the pixel cutting along a cutting line X-X' shown in FIG. 3A. The difference from FIG. 2 of the first embodiment is that the trench 10 of FIG. 3 is continued through a cell. If it is possible to make the P$^+$-type layer 5 shallow, the trench can proportionally be made shallow and the diffusion distance of electrons in the P$^+$-type layer 5 before and after of the trench being made shallow can be unchanged. If it is possible to make the trench shallow in such a manner, it is no need to deliberately divide the trench for relaxing the compressive stress and as shown in FIG. 3, and the trench 20 is made continued through a cell. In that case, since the light exposure area of a mask becomes wider by the continuous shape of the trench, that is easier to make the trench ultrafine than the divided shape of the trench.

Figure 4A:
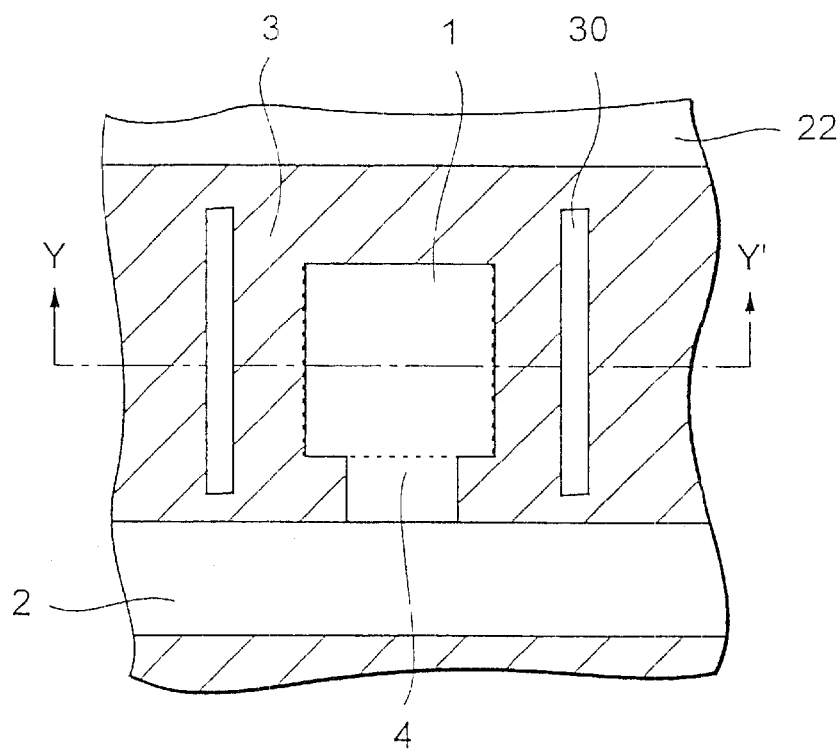
FIGS. 4A and 4B are a plane view and a cross-sectional view of a solid state imaging device of a third embodiment according to the present invention.
Figure 4B:
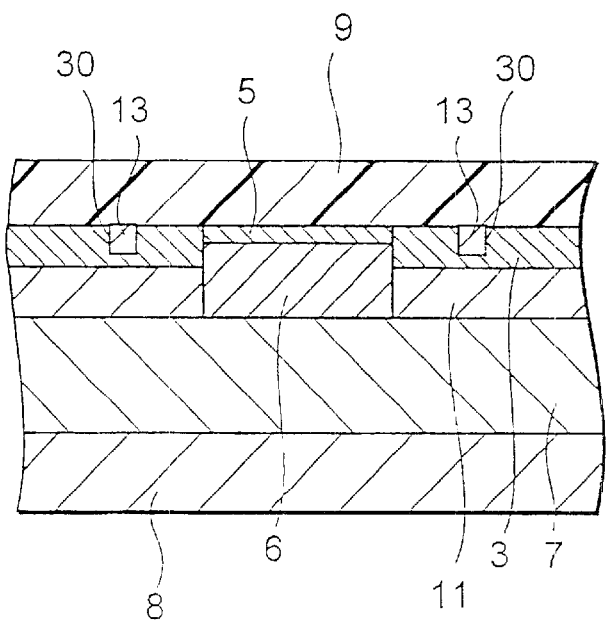

Next, the third embodiment of the present invention will be described with the reference of FIG. 4. FIG. 4A shows a plane view of a pixel to see the pixel from the upper side and FIG. 4B is a cross-sectional view of the pixel cutting along a cutting line Y-Y' shown in FIG. 4A. The difference from the first embodiment of FIG. 2 is that, in this third embodiment, the same trench 10 of the first embodiment laid between neighboring photodiodes in the sides of right and left of photodiode 1 when viewing right in front of the drawing. By the existence of trench 30, occurrence of color interference that caused by diffusion of electrons generated in the P+-type layer 5 into the region of the N-type layer of the photodiode neighboring to the photodiode 1 as mentioned above can be suppressed. This embodiment is more effective in the case when color interference is a more serious matter than smear is, just like a case of a vertically duple pixel type CCD in which the number of pixels in vertical direction of an image display screen is made duple in order to improve color reproducibility and the resolution degree.

Figure 5A:
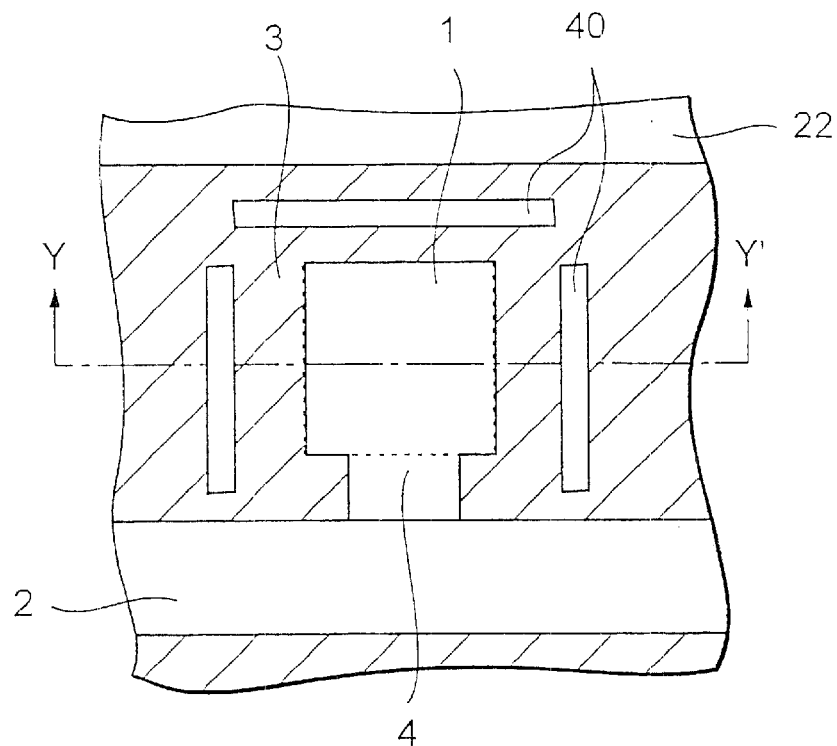
FIGS. 5A and 5B are a plane view and a cross-sectional view of a solid state imaging device of a fourth embodiment according to the present invention.
Figure 5B:
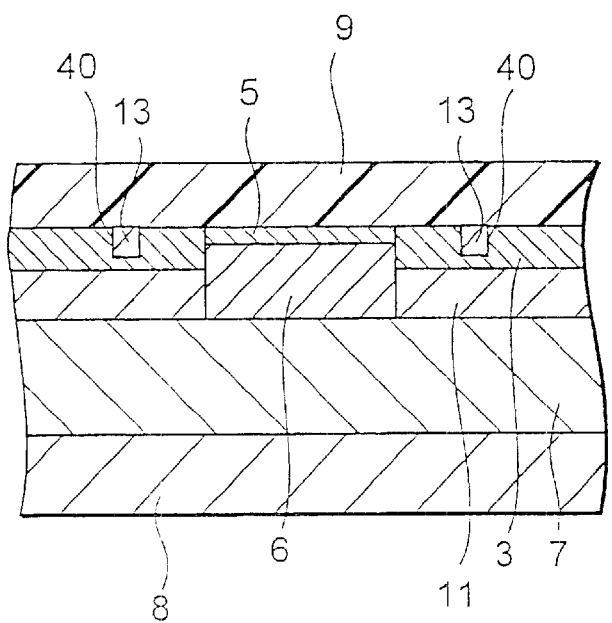

Moreover, the forth embodiment of the present invention will be described with the reference of FIG. 5. FIG. 5A shows a plane view of a pixel to see the pixel from the upper side and FIG. 5B is a cross-sectional view of the pixel cutting along a cutting line Y-Y' shown in FIG. 5A. In those elements, smear and color interference are simultaneously suppressed while stress caused in trench formation being relaxed by combining the advantageous points of the first embodiment and the third embodiment. As the illustrated trench 40, though the areas where no trench exists are not limited to four corners of the cell, it will be the optimum disposition if the parts are limited to the four corners of the cell from a viewpoint of relaxing the stress and also since the only a path through which diffusion electrons can pass becomes the longest diagonal course in the isolation layer.

Figure 6A:
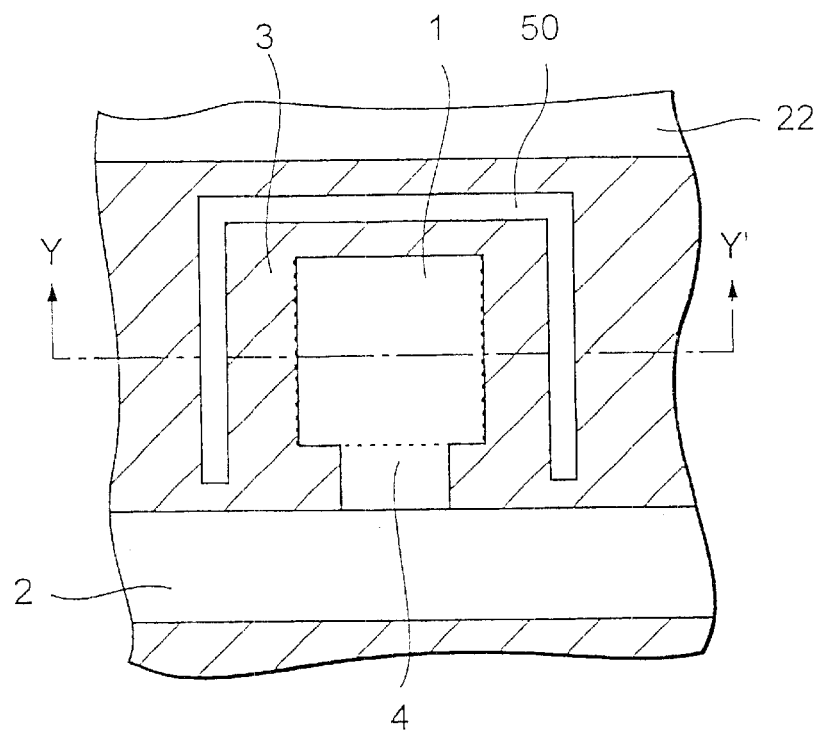
FIGS. 6A and 6B are a plane view and a cross-sectional view of a solid state imaging device of a fifth embodiment according to the present invention.
Figure 6B:
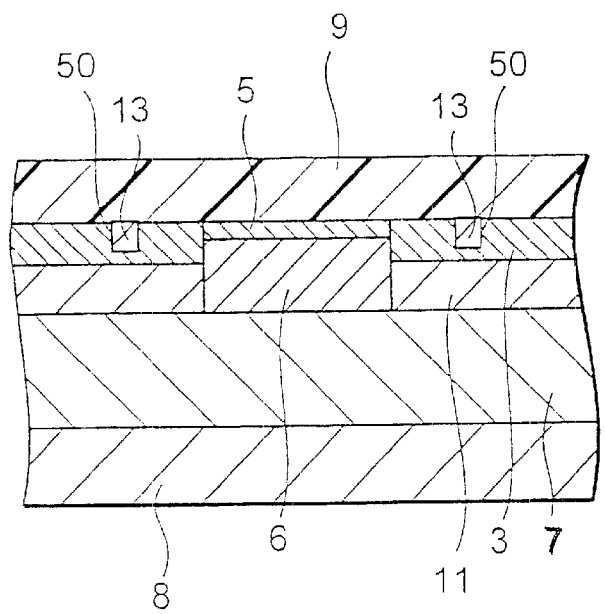

Next, the fifth embodiment of the present invention will be described with the reference of FIG. 6. FIG. 6A shows a plane view of a pixel to see the pixel from the upper side and FIG. 6B is a cross-sectional view of the pixel cutting along a the cutting line Y-Y' shown in FIG. 6A. In those elements smear and color interference are simultaneously suppressed owing to a continuously formed trench, which is easy to be made ultrafine, by combining the advantageous points of the second embodiment and the third embodiment. Also, since the trench 50 surrounds a cell, the path for diffusion electrons is forced from straight one into long detouring one and therefore false signals scarcely flow in a neighboring cell.

In the above described embodiments, the first conduction type is set to be N type and the second conduction type is set to be P type, however the essence of the present invention is unchanged, except that the life of holes in an N-type diffusion layer is 0.3 $\mu$sec, in devices in which the first conduction type is set to be P type and the second conduction type is set to be N type and it is needless to say that the configuration of the solid state imaging device of the present invention can also be applicable to such devices.

Furthermore, the insulator material in the inside of the trenches supposedly includes silicon oxide, silicon nitride, BPSG, a semiconductor with a wider band gap than that of the semiconductor of the substrate, or the compounded material of those as mentioned above, and it should be taken into account that the material buried in the trenches is not limited within those of mentioned above.

As described above, in the solid state imaging device of the present invention, minority carriers generated by photoelectric conversion in an isolation layer and a semiconductor region with the same conduction type as that of the isolation layer are provided with long effective diffusion length owing to a trench formed in the isolation layer and with no straight path, along which the minority carriers could diffuse, and then false signals scarcely enters to a neighboring cell, so that smear and color interference can be suppressed.

What is claimed is:
1. A solid state imaging device comprising:
   a first conduction type semiconductor region;
   a plurality of photodiode diffusion layers with the first conduction type formed in said semiconductor region;
   opposite conduction type isolation layers formed shallower than a plurality of said photodiode diffusion layers in said semiconductor region and separating at least a plurality of said photodiode diffusion layers from each other; and
   trenches formed in said isolation layers and filled with an insulator material.
2. The solid state imaging device as set forth in claim 1, wherein said trenches filled with said insulator material are formed in said isolation layers which are located on the opposite to a charge read-out region neighboring said photodiode diffusion layer in relation to said photodiode diffusion layer.
3. The solid state imaging device as set forth in claim 1, wherein said trenches filled with said insulator material are formed in said isolation layers which are located between said photodiode diffusion layers along charge transfer regions.
4. The solid state imaging device as set forth in claim 1, wherein said trenches filled with said insulator material are formed in said isolation layers which are located on the opposite to a charge read-out region neighboring said photodiode diffusion layer in relation to said photodiode and in said isolation layers which are located between said photodiode diffusion layers along charge transfer regions.
5. The solid state imaging device as set forth in claim 1, wherein said trenches filled with said insulator material are formed at a plurality of positions at intervals from one another in said isolation layers.
6. The solid state imaging device as set forth in claim 1, wherein said trenches filled with said insulator material are formed as to have a continuous shape in said isolation layers.
7. The solid state imaging device as set forth in claim 1, wherein said photodiode diffusion layers have cap layers with opposite conduction type on the surfaces.
8. A solid state imaging device, comprising:
   a semiconductor region of a first conduction type;
   plural photodiodes comprising photodiode diffusion layers of the first conduction type formed to a first depth in the semiconductor region;
   isolation layers of a second conduction type formed to a second depth shallower than the first depth and separating the photodiode diffusion layers from one another;
   trenches within in the isolation layers in regions of the isolation layers separating the photodiode diffusion layers from one another; and
   an insulator material filling the trenches.
9. The imaging device of claim 8, wherein the insulator material is silicon oxide.
10. The imaging device of claim 8, wherein the insulator material is silicon nitride.
11. The imaging device of claim 8, wherein the insulator material is BPSG.

12. The imaging device of claim 8, wherein the insulator material is an electrically insulator film.

13. The imaging device of claim 12, wherein the electrically insulator film is a compounded material including at least one from the group consisting of silicon oxide, silicon nitride, and BPSG.

14. The imaging device of claim 12, wherein,
- each of the photodiodes comprise a second conduction type layer forming an upper junction with the photodiode diffusion layer, and
- a depth of the trenches is deeper than the upper junction and shallower than the second depth.

15. The imaging device of claim 12, wherein a first of the photodiodes is separated by an adjacent of the photodiodes by plural, spaced-apart trenches filled with the insulator material.

16. The imaging device of claim 12, wherein a first of the photodiodes is separated by an adjacent of the photodiodes by a continuous trench filled with the insulator material.

17. The imaging device of claim 12, wherein a first of the photodiodes is separated from the other photodiodes by at a first trench filled with the insulator material adjacent a first edge of the first photodiode, a second trench filled with the insulator material adjacent a second edge of the first photodiode, and a third trench filled with the insulator material adjacent a third edge of the first photodiode,
- the first, second, and third trenches being continuous with each other.

18. The imaging device of claim 12, wherein a first of the photodiodes is separated from the other photodiodes by at least a first trench filled with the insulator material adjacent a first edge of the first photodiode and a second trench filled with the insulator material adjacent a second edge of the first photodiode, the first and second trenches being aligned parallel to each other and discontinuous from each other.

19. The imaging device of claim 18, wherein a first of the photodiodes is separated from the other photodiodes further by a third trench filled with the insulator material adjacent a third edge of the first photodiode, the third trench being discontinuous from the first and second trenches.

* * * * *